United States Patent [19]
Jacobsen et al.

[11] Patent Number: 5,973,398
[45] Date of Patent: Oct. 26, 1999

[54] SEMICONDUCTOR DEVICE AND FABRICATION METHOD EMPLOYING A PALLADIUM-PLATED HEAT SPREADER SUBSTRATE

[75] Inventors: Larry L. Jacobsen, Scotts Valley; Mohammad Eslamy, San Jose, both of Calif.

[73] Assignee: LSI Logic Corporation, Milpitas, Calif.

[21] Appl. No.: 08/963,813

[22] Filed: Nov. 4, 1997

[51] Int. Cl.[6] .......................... H01L 23/34; H01L 23/06; H01L 23/15

[52] U.S. Cl. .......................... 257/712; 257/706; 257/705; 257/693

[58] Field of Search .................................. 257/706, 705, 257/712, 675, 976, 693, 713

[56] References Cited

U.S. PATENT DOCUMENTS

| | | | |
|---|---|---|---|
| 5,402,006 | 3/1995 | O'Donley | 257/706 |
| 5,550,406 | 8/1996 | McCormick | 257/713 |
| 5,773,884 | 6/1998 | Andros et al. | 257/706 |
| 5,854,511 | 12/1998 | Shin et al. | 257/713 |

OTHER PUBLICATIONS

Milad, G., Internet publication entitled, "Electroless Palladium—A Surface Finish for Interconnect Technology," Atotech USA Inc., Somerset, NJ, pp. 1–5.

*Primary Examiner*—Mahshid Saadat
*Assistant Examiner*—Jhihan B Clark

[57] ABSTRACT

A semiconductor device and fabrication method are presented which employ a thermally conductive substrate having an outer layer of palladium. The substrate may be made of, for example, a metal such as copper. The substrate does not itself include layers of signal traces or bonding pads which function as device terminals, but provides a stiff backing for support of a flexible circuit which includes signal traces and bonding pads. An adhesive layer bonds the flexible circuit to the substrate. The outer layer of palladium has a desired surface roughness and chemical properties which improve the adhesion of the adhesive layer to the substrate. The substrate has opposed, substantially planar upper and underside surfaces. In one embodiment, the underside surface of the substrate has a die cavity, and the flexible circuit includes a set of conductors bonded to one side of a sheet of dielectric material (e.g., polyimide film). The sheet of dielectric material has an opening extending therethrough for receiving an upper surface of an integrated circuit. Each conductor has a first end which extends laterally across the film and into the opening and a second end which terminates at a bonding pad. The opening is surrounded by multiple apertures also which allow access to the substrate through the sheet of dielectric material for the bonding of a portion of the conductors to the substrate. The adhesive layer has openings which correspond to those of the sheet of dielectric material.

22 Claims, 3 Drawing Sheets

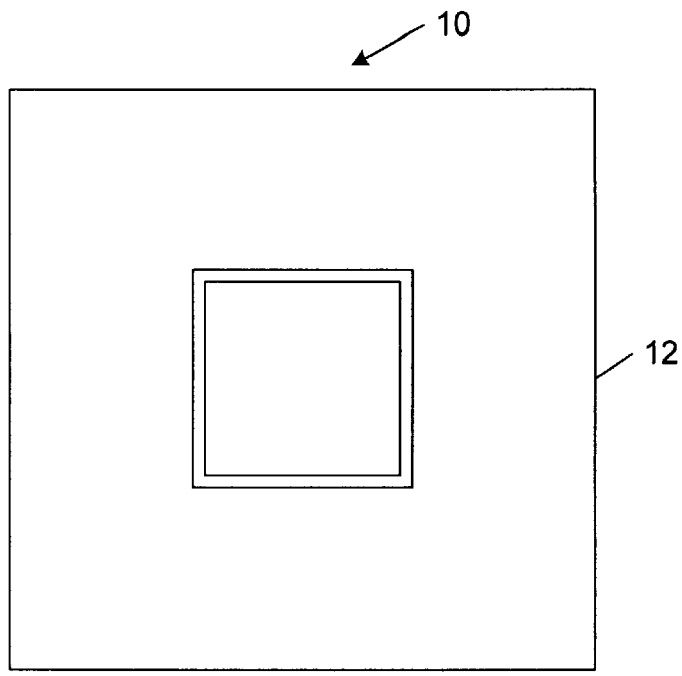
FIG. 1
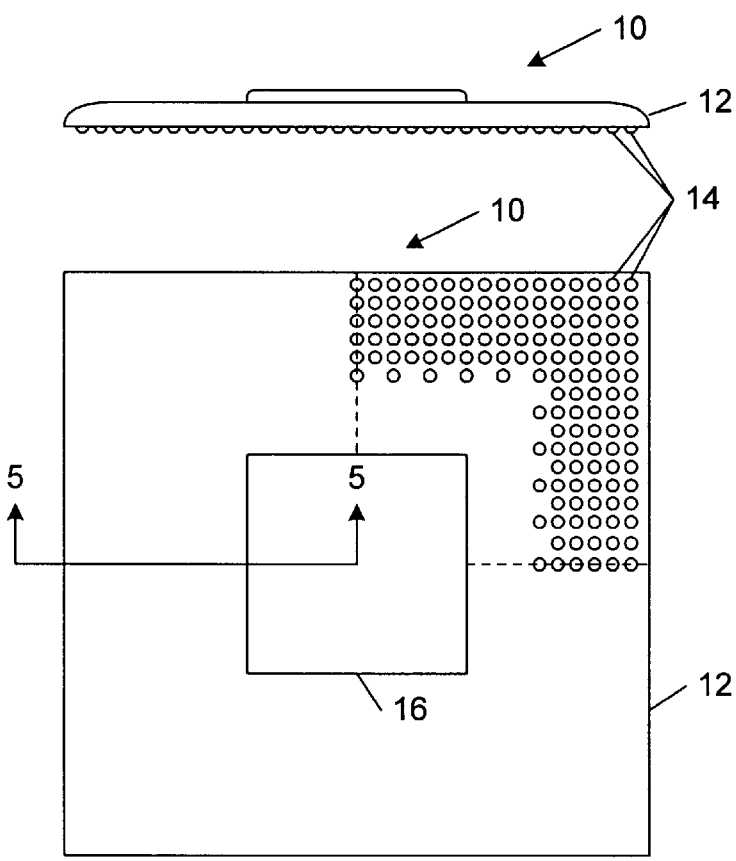
FIG. 2
FIG. 3

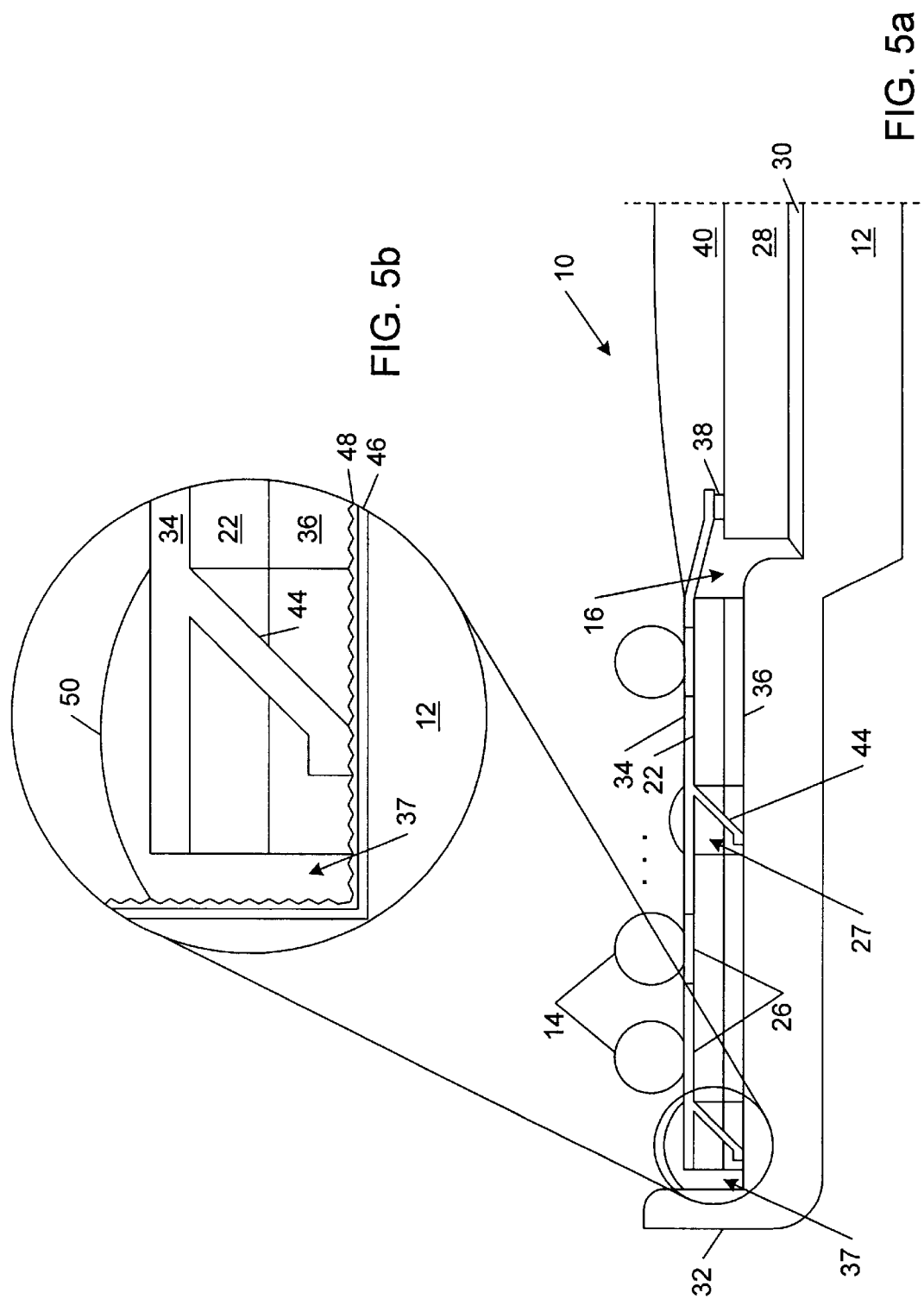

SEMICONDUCTOR DEVICE AND FABRICATION METHOD EMPLOYING A PALLADIUM-PLATED HEAT SPREADER SUBSTRATE

BACKGROUND OF THE INVENTION

1. Field of Invention

This invention relates to semiconductor device packages, and more particularly to semiconductor device packages employing a thermally conductive heat spreader substrate.

2. Description of Related Art

During manufacture of an integrated circuit (e.g., a microprocessor), signal lines formed upon the silicon substrate and to be connected to external devices are terminated at flat metal contact regions called input/output (I/O) pads. Following manufacture, the integrated circuit is typically secured within a protective semiconductor device package. Each I/O pad of the chip is then connected to a bonding pad of the device package, and ultimately to a terminal which typically extends from the periphery of the package.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages.

Grid array semiconductor device packages have terminals arranged in a two-dimensional array across an underside surface of the device package. An increasingly popular type of grid array device package is the ball grid array (BGA) device package. A BGA device includes a chip mounted upon a larger substrate made of, for example, fiberglass-epoxy printed circuit board material or ceramic material (e.g., aluminum oxide, alumina, $Al_2O_3$, or aluminum nitride, AlN). A BGA substrate typically includes two sets of bonding pads: a first set adjacent to the chip and a second set arranged in a two-dimensional array across the underside surface of the device package. The I/O pads of the chip are typically connected to corresponding members of the first set of bonding pads by signal lines. Members of the second set of bonding pads function as device package terminals. The solder balls on the underside of the BGA device package allow the device to be surface mounted to an ordinary PCB. The substrate also includes one or more layers of signal lines (i.e., traces) which connect respective members of the first and second sets of bonding pads. During PCB assembly, the BGA device package is attached to the PCB by heating the solder balls until they reflow. When the solder cools, the substrate is physically and electrically coupled to the PCB.

Common methods used to connect the I/O pads of the integrated circuit to bond traces of the device package include wire bonding and tape automated bonding (TAB). In wire bonding, connections are made using fine metal wires (e.g., gold or aluminum wires). TAB techniques connect I/O pads of the integrated circuit to bond traces of the device package using fine-line conductors etched from one or more sheets of metal (e.g., copper). The electrically conductive sheet is bonded to a sheet of a dielectric material (e.g., polyimide film), then portions of the conductive sheet are selectively removed in order to form the TAB conductors. The sheet of dielectric material maintains proper conductor spacing during handling and installation.

Some BGA packages with enhanced thermal performance employ a thermally conductive heat spreader substrate. The heat spreader substrate may be made of, for example, a metal such as copper. The heat spreader substrate does not itself include layers of signal traces or bonding pads which function as device terminals, but provides a stiff backing for support of a flexible TAB tape which includes signal traces and bonding pads. As with standard BGA packages, an integrated circuit is mounted substantially in the center of one surface of the heat spreader. The TAB tape surrounds the integrated circuit, and a layer of an adhesive is used to bond the TAB tape to the heat spreader substrate. One end of each TAB tape conductor is connected to an I/O pad of the integrated circuit, and the other end typically terminates at a bonding pad coated with solder which functions as a device terminal.

A problem arises, however, in the bonding of the TAB tape to the heat spreader substrate. Copper readily tarnishes and corrodes, thus bare copper is not a desirable product finish. In order to provide a tarnish- and corrosion-resistant finish, copper heat spreader substrates are commonly plated first with nickel, then with gold. However, the smoothness of the outer surface of the gold plating and the chemical stability of gold cause an eventual lack of adhesion (i.e., a delamination) at the interface between the adhesive layer which bonds the TAB tape to the heat spreader substrate and the heat spreader substrate itself. Repeated heating and cooling of the device package accelerates the delamination process. The resulting physical separation between the heat spreader substrate and the TAB tape places undue stress on the delicate conductors of the TAB tape and creates a long-term device package reliability problem.

It would be advantageous to have a device package employing a heat spreader substrate and having a stable bond between the heat spreader substrate and a flexible TAB tape including signal traces and bonding pads. Such a device package would possess both improved heat transfer characteristics and long-term operational reliability.

SUMMARY OF THE INVENTION

The problems outlined above are in large part solved by a semiconductor device and fabrication method employing a thermally conductive substrate having an outer layer of palladium. The substrate may be made of, for example, a metal such as copper. The substrate does not itself include layers of signal traces or bonding pads which function as device terminals, but provides a stiff backing for support of a flexible circuit which includes signal traces and bonding pads. An adhesive layer bonds the flexible circuit to the substrate. The outer layer of palladium has a desired surface roughness and chemical properties which improve the adhesion of the adhesive layer to the substrate.

The substrate has opposed, substantially planar upper and underside surfaces. In one embodiment, the underside surface of the substrate has a die cavity, and the flexible circuit includes a set of conductors bonded to one side of a sheet of dielectric material (e.g., polyimide film). The sheet of dielectric material has an opening extending therethrough for receiving an upper surface of an integrated circuit. Each conductor has opposed first and second ends. The first end of each conductor extends laterally across the film and into the opening, and the second end of each conductor terminates at a bonding pad. The opening is surrounded by multiple apertures also extending through the sheet of dielectric material. The apertures allow access to the substrate through the sheet of dielectric material for the bonding of a portion of the conductors to the substrate. The adhesive layer has corresponding openings, and bonds the sheet of dielectric material to the underside surface of the substrate such that the side of the sheet of dielectric material having conductors bonded thereto faces away from the substrate.

When the substrate is made of copper, the outer layer of palladium is preferably formed over a first layer of nickel. The thickness of the layer of nickel is preferably between about 10 microns and approximately 20 microns, and the thickness of the outer layer of palladium is preferably about 50 microns. The present method of fabricating a semiconductor device includes providing the thermally conductive substrate and flexible circuit described above, along with an integrated circuit. The integrated circuit includes at least one electronic device formed upon a monolithic semiconductor substrate and has multiple input/output (I/O) pads arranged about the periphery of an upper surface. An underside surface of the integrated circuit is attached to the substrate within the die cavity. A layer of an adhesive material is applied to the underside surface of the substrate surrounding the integrated circuit. The layer of adhesive material is preferably a precut piece of double-sided, thermally-conductive adhesive tape. The outer layer of palladium enhances adhesion between the layer of adhesive material and the substrate. The flexible circuit is positioned upon the layer of adhesive material such that the side of the sheet of dielectric material having conductors bonded thereto faces away from the substrate, and the upper surface of the integrated circuit is exposed through the opening. The layer of adhesive material attaches the flexible circuit to the underside of the substrate. The first ends of each conductor are connected to corresponding members of the set of I/O pads.

BRIEF DESCRIPTION OF THE DRAWINGS

Other objects and advantages of the invention will become apparent upon reading the following detailed description and upon reference to the accompanying drawings in which:

FIG. 1 is a top plan view of one embodiment of a semiconductor device in accordance with the present invention, wherein the semiconductor device includes an adhesive layer which bonds a flexible circuit to a thermally conductive substrate, and wherein the substrate includes an outer layer of palladium which has a desired surface roughness and chemical properties which improve the adhesion of the adhesive layer to the substrate;

FIG. 2 is a side elevation view of the semiconductor device of FIG. 1;

FIG. 3 is a bottom plan view of the semiconductor device of FIG. 1;

FIG. 5a is a partial cross-sectional view of the semiconductor device as indicated in FIG. 3; and FIG. 5b is an enlarged view of a portion of the semiconductor device as indicated in FIG. 5a illustrating how the surface roughness properties of the outer palladium layer improve the adhesion of the adhesive layer and an encapsulant material to the substrate.

Figure 4:
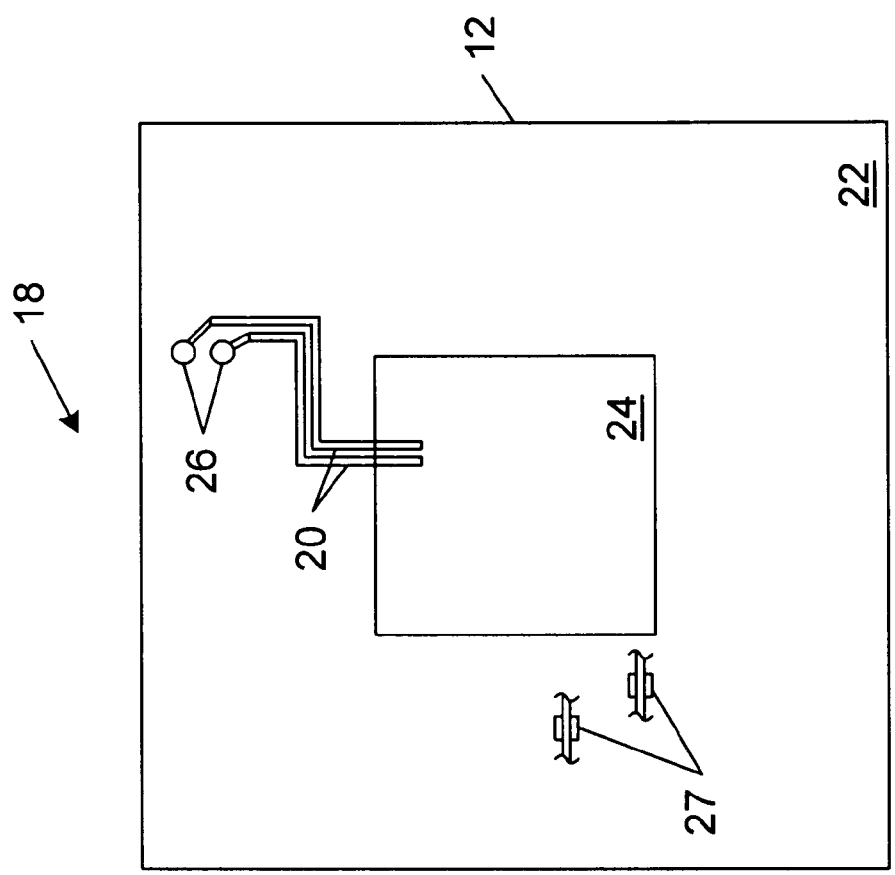
FIG. 4 is a top plan view of one embodiment of the flexible circuit which is bonded to an underside surface of the substrate of the semiconductor device of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a top plan view of one embodiment of a semiconductor device 10 in accordance with the present invention. Semiconductor device 10 includes a thermally conductive heat spreader substrate 12. Heat spreader substrate 12 is preferably made of a metal (e.g., copper). As will be described in more detail below, heat spreader substrate 12 has an outer coating of palladium which has desired surface roughness and chemical properties which improve adhesion to an adhesive layer applied to heat spreader substrate 12. FIG. 2 is a side elevation view of semiconductor device 10, and FIG. 3 is a bottom plan view of semiconductor device 10. Solder balls 14 arranged upon an underside surface of semiconductor device 10, preferably in a two-dimensional array as shown in FIG. 3, extend from bonding pads which function as device terminals. It is noted that the bonding pads may alternatively have pins extending therefrom for connecting to a PCB or for inserting into a socket. Heat spreader substrate 12 includes a die cavity 16 located substantially in the center of the underside surface. Die cavity 16 is dimensioned to receive an integrated circuit. The integrated circuit includes at least one electronic device formed upon a monolithic semiconductor substrate and has multiple input/output (I/O) pads arranged about the periphery of an upper surface.

FIG. 4 is a top plan view of one embodiment of a flexible circuit 18 which is bonded to the underside surface of heat spreader substrate 12. Flexible circuit 18 is preferably a TAB tape, and includes a patterned layer of an electrically conductive material (e.g., copper) bonded to a sheet of dielectric material 22. The electrically conductive layer is patterned to form multiple electrically conductive signal lines (i.e., traces). Representative conductive traces 20 are shown in FIG. 4. Flexible circuit 18 is sized to fit within the boundaries of the underside surface of heat spreader substrate 12, and includes a die aperture 24 which fits around an integrated circuit mounted within die cavity 16. Flexible circuit 18 also includes several bonding apertures 27 spanned by conductive traces 20.

Sheet of dielectric material 22 is preferably a polyimide material, and maintains proper spacing of conductive traces 20 during handling and installation of flexible circuit 18. Each conductive trace 20 typically has two ends. A first end extends into die aperture 24 and extends over an associated I/O pad of the integrated circuit. The other end terminates at a bonding pad 26 formed upon dielectric material 22. Once connected to an I/O pad, each conductive trace 20 forms an electrically conductive signal path between the I/O pad and an associated bonding pad 26. Bonding pads 26 are coated with solder and function as terminals of semiconductor device 10.

FIG. 5a is a partial cross-sectional view of semiconductor device 10 as indicated in FIG. 3 showing flexible circuit 18 bonded to heat spreader substrate 12. An underside surface of an integrated circuit 28 is mounted to heat spreader 12 within die cavity 16 using a die attach adhesive material 30 (e.g., a thermally-conductive epoxy such as Abelstik No. 965-1L, Abelstik Co., Rancho Dominguez, Calif.). Integrated circuit 28 includes at least one electronic device formed upon a monolithic semiconductor substrate. In the embodiment of FIG. 5a, a continuous lip 32 extends around the outer perimeter of the underside surface of heat spreader substrate 12. As described above, flexible circuit 18 includes patterned conductive layer 34 bonded to sheet of dielectric material 22. Conductive layer 34 is patterned to form conductive traces 20 and bonding pads 26. Solder balls 14 are formed by coating bonding pads 26 with solder.

Flexible circuit 18 is dimensioned to substantially cover the underside surface of heat spreader substrate 12 and to fit within the boundaries defined by continuous lip 32. An upper surface of integrated circuit 28 is exposed through die aperture 24 of flexible circuit 18. Flexible circuit 18 is positioned around integrated circuit 28 such that patterned conductive layer 34 faces away from heat spreader substrate 12. Flexible circuit 18 is bonded to the underside surface of heat spreader substrate 12 by an adhesive layer 36. Adhesive layer 36 has openings corresponding to die aperture 24 and bonding apertures 27 of flexible circuit 18. Following the bonding of flexible circuit 18 to the underside surface of heat spreader substrate 12, a narrow gap or "slot" 37 exists along the entire periphery of semiconductor device 10 between flexible circuit 18 and lip 32 of heat spreader substrate 12.

Integrated circuit 28 includes multiple I/O pads 38 formed about the periphery of the upper surface. The ends of conductive traces 20 extending into die aperture 24 and over associated I/O pads 38 are connected to the I/O pads 38 using any of various well known TAB bonding techniques (e.g., applied heat and/or pressure). Following the bonding of conductive traces 20 to I/O pads 38, a die coat material 40 is applied to the upper surface of integrated circuit 28 which encapsulates the bonds and fills the voids within die cavity 16. Die coat material 40 protects the bonded surfaces from moisture and other contaminants.

Adhesive layer 36 is preferably a precut piece of double-sided tape material having a large hole which corresponds to die aperture 24 of flexible circuit 22 and several smaller holes which correspond to bonding apertures 27. Adhesive layer 36 is also preferably thermally conductive in order to provide additional heat transfer paths during operation of integrated circuit 18. A suitable double-sided, thermally-conductive adhesive tape is the Thermattach T-427 product manufactured by Chomerics (Woburn, Mass.). The Thermattach T-427 tape consists of a 0.001 inch thick Kapton thermally conductive polyimide film coated on both sides with a pressure sensitive modified acrylic adhesive filled with thermally conductive aluminum oxide (alumina, $Al_2O_3$) particles.

In the embodiment of FIG. 5a, heat spreader substrate 12 acts as a continuous ground plane. Various conductive traces 20 of patterned conductive layer 34 are bonded to heat spreader substrate 12 through bonding apertures 27. During such bonding, a conductive trace 20 spanning a bonding aperture 27 is broken by a bonding tool. A resulting free end 44 of the conductive trace 20 is bent toward heat spreader substrate 12 through the bonding aperture 27 until free end 44 contacts heat spreader substrate 12. Free end 44 is then bonded to heat spreader substrate 12 using any of various well known TAB bonding techniques (e.g., applied heat and/or pressure). Such bonding is used to electrically connect heat spreader substrate 12 to an electrical ground potential coupled to one or more bonding pads 26 through solder balls 14. Such bonding is also used to connect selected I/O pads 38 of integrated circuit 28 to the ground potential via heat spreader substrate 12.

FIG. 5b is an enlarged view of a portion of semiconductor device 10 indicated in FIG. 5a. According to the present invention, heat spreader substrate 12 is first plated with nickel, forming a nickel layer 46. Nickel layer 46 is preferably about 10 to 20 microns thick. Heat spreader substrate 12 is then plated with palladium, forming a palladium layer 48. Palladium layer 48 is preferably about 50 microns thick. Due to the planar nature of the major surfaces of heat spreader substrate 12, electrolytic rack plating is the preferred plating method.

Following the bonding of the free ends 44 of broken conductive traces 20 to heat spreader substrate 12, bonding apertures 27 and the corresponding openings in adhesive layer 36, as well as slot 37 extending around the entire periphery of semiconductor device 10, are filled with an encapsulant material 50. Encapsulant material 50 protects the bonded surfaces from moisture and other contaminants. A suitable encapsulant material 50 is Dexter HYSOL® No. FP4511, a liquid epoxy designed to fill narrow gaps in BGA device packages (Dexter Electronic Materials, Industry, Calif.).

The roughness of the surface of palladium layer 48 aids in the adhesion between adhesive layer 36 and heat spreader substrate 12, and also between encapsulant material 50 and heat spreader substrate 12. A high degree of elevational disparity exists in the surface of palladium layer 48, providing a corresponding high degree of mechanical interlocking at the interfaces between adhesive layer 36 and heat spreader substrate 12, and also between encapsulant material 50 and heat spreader substrate 12. It is also believed that the palladium may react with organic molecules within adhesive layer 36 and encapsulant material 50, forming chemical bonds at the interface between adhesive layer 36 and heat spreader substrate 12 and also at the interface between encapsulant material 50 and heat spreader substrate 12. Such chemical bonds further enhance adhesion at these interfaces.

A method of fabricating semiconductor device 10 includes providing thermally conductive heat spreader substrate 12 made of, for example, copper. Heat spreader substrate 12 is plated with nickel to form nickel layer 46, then with palladium to form palladium layer 48. The underside surface of Integrated circuit 28 is then mounted to the underside surface of heat spreader substrate 12 within die cavity 16 using die attach material 30. Adhesive layer 36 is then applied to the underside surface of heat spreader substrate 12 surrounding integrated circuit 28. Adhesive layer 36 is preferably a precut piece of double-sided, thermally-conductive Thermattach T-427 adhesive tape as described above. Flexible circuit 18 is then positioned upon adhesive layer 36 such that patterned conductive layer 34 faces away from heat spreader substrate 12 and the upper surface of integrated circuit 28 is exposed through die aperture 24. The ends of conductive traces 20 extending into die aperture 24 and over associated I/O pads 38 of integrated circuit 28 are connected to the I/O pads 38 using a TAB bonding technique. Conductive traces 20 spanning bonding apertures 27 are broken, and the resulting free ends are bonded to heat spreader substrate 12 through the bonding apertures 27 using a TAB bonding technique. Die coat material 40 is applied to the upper surface of integrated circuit 28, and encapsulant material 50 is applied to bonding apertures 27 and slot 37. The roughness of the surface of palladium layer 48 aids in the adhesion between adhesive layer 36 and heat spreader substrate 12, and also between encapsulant material 50 and heat spreader substrate 12.

Several semiconductor devices were manufactured in accordance with the above described method and subjected to rigorous stress testing. First, the devices were preconditioned by maintaining them at a temperature of 30 degrees Celsius (deg. C) in an atmosphere having 60 percent relative humidity for 80 hours. Then the devices were cycled between a minimum temperature of −55 deg. C and a maximum temperature of +150 deg. C for a total of 1,000 cycles. Following the stress testing, no delamination was noted between adhesive layer 36 and heat spreader substrate 12 or between encapsulant material 50 and heat spreader substrate 12 in any of the tested devices.

It will be appreciated by those skilled in the art having the benefit of this disclosure that this invention is believed to be a semiconductor device and fabrication method which employ a thermally conductive substrate having an outer layer of palladium. An adhesive layer bonds a flexible circuit to the substrate. The outer layer of palladium has a desired surface roughness and chemical properties which improve the adhesion of the adhesive layer to the substrate. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An integrated circuit package, comprising:
   a thermally conductive substrate having a surface with a palladium coating;
   a flexible circuit comprising a plurality of conductors spacedly arranged upon and bonded to a side of a sheet of dielectric material, wherein the sheet of dielectric material maintains the spaced arrangement of the conductors during handling and installation of the flexible circuit;
   an adhesive layer bonding the flexible circuit to the surface of the substrate; and
   wherein the palladium coating enhances adhesion between the adhesive layer and the surface of the substrate.

2. The integrated circuit package as recited in claim 1, wherein said sheet of dielectric material has:
   an opening extending therethrough and dimensioned to receive an integrated circuit; and
   a plurality of apertures surrounding said opening and extending through the sheet of dielectric material wherein each of the plurality of apertures is aligned over a selected site upon the surface of the substrate where one of the plurality of conductors is to be mechanically and electrically bonded to the substrate.

3. The integrated circuit package as recited in claim 1, wherein the thermally conductive substrate is copper upon which the palladium coating is applied.

4. The integrated circuit package as recited in claim 1, wherein the palladium coating is about 50 microns thick.

5. The integrated circuit package as recited in claim 2, wherein each of the plurality of conductors has opposed first and second ends, and wherein the first end of each of the plurality of conductors extends laterally across said sheet of dielectric material into said opening, and wherein the second end of each of the plurality of conductors terminates at a bonding pad formed upon the side of the sheet of dielectric material.

6. The integrated circuit package as recited in claim 3, further comprising an integrated circuit fixedly secured to said substrate and extending through said opening.

7. The integrated circuit package as recited in claim 3, wherein the copper substrate has a layer of nickel formed between the substrate and the palladium coating.

8. The integrated circuit package as recited in claim 7, wherein the thickness of the layer of nickel is between about 10 microns and approximately 20 microns.

9. The integrated circuit package as recited in claim 6, wherein said integrated circuit comprises a plurality of pads adapted to directly receive the first ends of said set of conductors.

10. A semiconductor device, comprising:
    a thermally conductive substrate having opposed upper and underside surfaces, wherein the substrate has a die cavity within an underside surface dimensioned to receive an integrated circuit, and wherein the substrate has an outer layer of palladium;
    an integrated circuit having opposed upper and underside surfaces and comprising a set of input/output (I/O) pads arranged upon the upper surface, wherein the underside surface of the integrated circuit is attached to the substrate within the die cavity;
    a flexible circuit, comprising:
      a sheet of dielectric material having an opening extending therethrough, wherein the integrated circuit is positioned within the opening such that the upper surface of the integrated circuit is exposed through the opening, and wherein the opening is surrounded by a plurality of apertures also extending through the sheet of dielectric material; and
      a set of conductors bonded to one side of the sheet of dielectric material, wherein each conductor has opposed first and second ends, and wherein the first end of each conductor extends laterally across said film, into said opening, and is connected to an I/O pad of the integrated circuit, and wherein the second end of each conductor terminates at a bonding pad; and
    an adhesive layer which bonds the sheet of dielectric material of the flexible circuit to the underside surface of the substrate such that the side of the sheet of dielectric material having conductors bonded thereto faces away from the substrate;
    wherein conductors are mechanically and electrically bonded to the substrate within the apertures; and
    wherein the outer layer of palladium enhances adhesion between the adhesive layer and the substrate.

11. The semiconductor device as recited in claim 10, wherein the thermally conductive substrate is copper.

12. The semiconductor device as recited in claim 10, wherein the integrated circuit comprises at least one electronic device formed upon a monolithic semiconductor substrate.

13. The semiconductor device as recited in claim 10, wherein the flexible circuit is fabricated by depositing the sheet of dielectric material upon a sheet of conductive material, then patterning the sheet of conductive material to form the set of conductors.

14. The semiconductor device as recited in claim 10, wherein the flexible circuit is fabricated by depositing a layer of a conductive material upon the sheet of dielectric material, then patterning the layer of conductive material to form the set of conductors.

15. The semiconductor device as recited in claim 11, wherein the copper substrate has a layer of nickel formed thereupon, and wherein the outer layer of palladium is formed over the layer of nickel.

16. The semiconductor device as recited in claim 15, wherein the thickness of the layer of nickel is between about 10 microns and approximately 20 microns.

17. The semiconductor device as recited in claim 15, wherein the outer layer of palladium is about 50 microns thick.

18. The semiconductor device as recited in claim 13, wherein the dielectric material is polyimide.

19. The semiconductor device as recited in claim 18, wherein the conductive material is copper.

20. An integrated circuit package, comprising:

a thermally conductive substrate having a surface with a palladium coating;

a flexible circuit comprising a plurality of conductors spacedly arranged upon and bonded to a side of a sheet of dielectric material, wherein the sheet of dielectric material maintains the spaced arrangement of the conductors during handling and installation of the flexible circuit, and wherein the sheet of dielectric material has:

an opening extending therethrough and dimensioned to receive an integrated circuit; and a plurality of apertures surrounding said opening and extending through the sheet of dielectric material, wherein each of the plurality of apertures is aligned over a selected site upon the surface of the substrate where one of the plurality of conductors is to be mechanically and electrically bonded to the substrate;

an adhesive layer bonding the flexible circuit to the surface of the substrate; and wherein the palladium coating enhances adhesion between the adhesive layer and the surface.

21. The integrated circuit package as recited in claim 20, wherein the adhesive layer bonds the sheet of dielectric material to the surface of the substrate such that the side of the sheet of dielectric material faces away from the surface of the substrate.

22. The integrated circuit package as recited in claim 21, wherein each of the plurality of conductors has opposed first and second ends, and wherein the first end of each of the plurality of conductors extends laterally across said sheet of dielectric material into said opening, and wherein the second end of at least one of the plurality of conductors terminates at a bonding pad formed upon the side of the dielectric material.

* * * * *